United States Patent
Haruta

(10) Patent No.: US 8,013,692 B2
(45) Date of Patent: Sep. 6, 2011

(54) BOUNDARY ACOUSTIC WAVE DEVICE

(75) Inventor: Kazumasa Haruta, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 12/962,864

(22) Filed: Dec. 8, 2010

(65) Prior Publication Data

US 2011/0080234 A1    Apr. 7, 2011

Related U.S. Application Data

(63) Continuation of application No. PCT/JP2009/002193, filed on May 19, 2009.

(30) Foreign Application Priority Data

Jun. 16, 2008 (JP) ................ 2008-156283

(51) Int. Cl.
*H03H 9/64* (2006.01)
(52) U.S. Cl. .............. 333/193; 333/195; 310/313 B
(58) Field of Classification Search .......... 333/193–196, 333/133; 310/313 R, 313 B, 313 D
See application file for complete search history.

(56) References Cited

U.S. PATENT DOCUMENTS

| 7,466,061 B2 * | 12/2008 | Miura et al. ............. 310/313 R |
| 7,583,161 B2 * | 9/2009 | Tanaka ...................... 333/133 |
| 2006/0192462 A1 * | 8/2006 | Iwamoto et al. ............ 310/348 |

FOREIGN PATENT DOCUMENTS

| EP | 1 453 198 A2 | 9/2004 |
| JP | 2003-8394 A | 1/2003 |
| JP | 2003-101384 A | 4/2003 |
| JP | 2004-282707 A | 10/2004 |
| WO | 2008/038498 A1 | 4/2008 |

OTHER PUBLICATIONS

Official Communication issued in International Patent Application No. PCT/JP2009/002193, mailed on Jul. 14, 2009.

* cited by examiner

*Primary Examiner* — Barbara Summons
(74) *Attorney, Agent, or Firm* — Keating & Bennett, LLP

(57) ABSTRACT

A boundary acoustic wave device includes an electrode structure that is provided at the interface between a piezoelectric substrate and a dielectric layer. The electrode structure defines a ladder filter in which at least two ground pads of a plurality of ground pads, to be connected to a ground potential, provided on the piezoelectric substrate are electrically connected by a connection conductor provided on the dielectric layer, and all of the ground pads are electrically connected.

10 Claims, 6 Drawing Sheets

BOUNDARY ACOUSTIC WAVE DEVICE

BACKGROUND OF THE INVENTION

1. Field of the Invention

The present invention relates to a boundary acoustic wave device including an electrode structure arranged at the interface between a piezoelectric substrate and a dielectric layer, and more specifically, to a boundary acoustic wave filter including a ladder circuit configuration.

2. Description of the Related Art

It is required that a band pass filter used in cellular phones have a large amount of attenuation in bands outside of a passband. In the past, a surface acoustic wave filter device has widely been used as such a band pass filter.

FIG. 10 is a circuit diagram showing a surface acoustic wave filter device disclosed in Japanese Unexamined Patent Application Publication No. 2003-101384. The surface acoustic wave filter device 1001 includes a series arm that connects an input terminal 1002 and an output terminal 1003. On the series arm, series arm resonators 1004 to 1006 are connected in series. A plurality of parallel arms are connected to the series arm. Each of the parallel arms includes a parallel arm resonator 1007.

Inductors L are respectively connected between the input terminal 1002 and the series arm resonator 1004, and between the series arm resonator 1006 and the output terminal 1003. Inductors L are also respectively connected to the ends of the parallel arm resonators 1007. These inductors L represent inductance components of wiring lines, connection portions, or bonding wires between the surface acoustic wave resonator chips and a package on which the chips are mounted.

An inductor Lp shown in FIG. 10 represents an inductance component of the portions from the connection pads on the package to the ground electrodes of an apparatus where the surface acoustic wave filter device 1001 is mounted, in other words, ground electrodes 1008 and 1009 shown in FIG. 10.

In the surface acoustic wave filter device 1001, a capacitor 1010 is connected between the end of the parallel arm closest to the input terminal 1002 and the parallel arm closest to the output terminal 1003.

The attenuation in a band lower than a passband can be increased while maintaining the width of the passband, by making the inductance component Lp extremely small and selecting an appropriate value for the inductance component L. However, in actual surface acoustic wave devices, it is very difficult to make the value of the inductance component Lp small due to restrictions on wiring of lines and other circuit limitations. Thus, in the surface acoustic wave filter device disclosed in Japanese Unexamined Patent Application Publication No. 2003-101384, it is possible to increase the attenuation outside of the passband without decreasing the inductance component Lp by providing the capacitor 1010 described above.

On the other hand, a boundary acoustic wave filter device, which has a reduced size as compared to a surface acoustic wave device, has recently drawn attention as an alternative to a surface acoustic wave filter device.

In the surface acoustic wave filter device disclosed in Japanese Unexamined Patent Application Publication No. 2003-101384, the attenuation outside of a passband is increased by providing the capacitor 1010. However, such a configuration is effective when a structure having a high inductance, such as a bonding wire, is connected to the ground terminal of the parallel arm resonator in a ladder filter.

On the other hand, in a boundary acoustic wave device, an electrode structure for exciting boundary acoustic waves is arranged at the interface between a piezoelectric layer and a dielectric layer and embedded in a boundary acoustic wave device chip. Thus, a package is not required, and the wiring lines do not have a large inductance component. Consequently, the method of increasing the attenuation outside of a passband by using the inductance component L and the capacitor 1010 described in Japanese Unexamined Patent Application Publication No. 2003-101384 is not effective for a boundary acoustic wave device.

Although there may be a method of providing an inductance component and a capacitance component by connecting an external device, this method will significantly diminish the advantage of a reduced size of a boundary acoustic wave device.

SUMMARY OF THE INVENTION

To overcome the problems described above, preferred embodiments of the present invention provide a boundary acoustic wave device including a ladder circuit configuration which increases the attenuation outside of a passband and advantageously enables a reduction in size.

According to a preferred embodiment of the present invention, a boundary acoustic wave device includes a piezoelectric substrate, a first dielectric layer provided on the piezoelectric substrate, and an electrode structure provided at an interface between the piezoelectric substrate and the first dielectric layer. The electrode structure includes a plurality of series arm resonators connected to one another in series on a series arm that connects an input terminal and an output terminal, a parallel arm resonator connected between the series arm and a ground potential on each of a plurality of parallel arms provided between the series arm and the ground potential, a plurality of ground wiring lines respectively connected to ends, to be connected to the ground potential, of the plurality of the parallel arms, and a plurality of ground pads respectively connected to the plurality of the ground wiring lines. The electrode structure preferably defines a ladder filter.

The boundary acoustic wave device preferably further includes a signal wiring line defining the series arm arranged so as to be located between at least two of the plurality of the ground pads, and a ground connection conductor arranged to electrically connect the at least two ground pads. The signal wiring line three-dimensionally crosses the ground connection conductor with the first dielectric layer therebetween, and all of the ground pads are electrically connected.

In the boundary acoustic wave device according to the present preferred embodiment, preferably, the signal wiring line is disposed on the piezoelectric substrate, the ground connection conductor is electrically connected to the at least two ground pads through via hole conductors provided in and extending through the first dielectric layer, and the signal wiring line three-dimensionally crosses the ground connection conductor with the first dielectric layer therebetween. In this case, using three-dimensional crossing enables an increase in wiring density and a further reduction in the size of the boundary acoustic wave device.

In a preferred embodiment of the present invention, the ground connection conductor is preferably electrically connected to all the ground pads. In this case, all of the ground pads are electrically connected by the ground connection conductor, and grounding is reliably strengthened. In addition, the configuration in which all of the ground pads are connected by the ground connection conductor simplifies the electrode structure on the piezoelectric substrate, since separate ground wiring lines are not required to electrically connect the ground pads to one another on the piezoelectric substrate.

In another preferred embodiment of the present invention, a capacitance is preferably provided in a portion in which the ground connection conductor faces the ground wiring line with the first dielectric layer therebetween. In this case, since the ground connection conductor is coupled with the ground potential by the capacitance, grounding is further strengthened.

In another preferred embodiment of the present invention, preferably, a portion of the signal wiring line is provided on the first dielectric layer and is electrically connected to the other portions of the signal line through via hole conductors extending through the first dielectric layer, the ground connection conductor is provided on the piezoelectric substrate, and the portion of the signal wiring line three-dimensionally crosses the ground connection conductor with the first dielectric layer therebetween.

In another preferred embodiment of the present invention, preferably, the ladder filter includes a first filter circuit portion arranged on an input end side and a second filter circuit portion arranged on an output end side, each of the first and second filter circuit portions includes at least one of the series arm resonators connected to the series arm and at least one of the parallel arm resonators arranged on at least one of the parallel arms, and ends, to be connected to the ground potential, of the first and second filter circuit portions are electrically connected to each other by the ground connection conductor. In this case, grounding in the boundary acoustic wave device is further strengthened.

In another preferred embodiment of the present invention, preferably, through holes are provided in the first dielectric layer so as to expose the ground pads, and the via hole conductors are provided on the inner surfaces of the through holes. In addition, the boundary acoustic wave device preferably further includes under-bump metal layers that are filled in the through holes and metal bumps provided on the under-bump metal layers. In this case, the boundary acoustic wave device can be easily surface-mounted on a circuit board or other suitable structure using metal bumps and a flip chip bonding process, for example.

In another preferred embodiment of the present invention, the boundary acoustic wave device preferably further includes a sound absorbing resin layer which is arranged so as to cover the ground connection conductor or the portion of the signal wiring line provided on the first dielectric layer. By using the sound absorbing resin layer, waves that leak out of the surface of the dielectric layer are reliably absorbed, whereby the attenuation characteristics are effectively improved.

In another preferred embodiment of the present invention, the boundary acoustic wave device preferably further includes a second dielectric layer which is arranged so as to cover the ground connection conductor or the portion of the signal wiring line provided on the first dielectric layer.

In another preferred embodiment of the present invention, the boundary acoustic wave device preferably further includes a second dielectric layer which is disposed between the first dielectric layer and the ground connection conductor or the portion of the signal wiring line provided on the first dielectric layer.

In the boundary acoustic wave device according to various preferred embodiments of the present invention, all of the ground pads are preferably electrically connected by a ground connection conductor provided on a dielectric layer or a piezoelectric substrate, and thus, as compared to a configuration in which respective ground pads are individually connected to a ground potential, grounding is strengthened. In other words, grounding is strengthened because the number of paths along which currents flow to the ground potential is increased. Thus, the attenuation outside of a passband is increased.

According to various preferred embodiments of the present invention, since grounding is strengthened using the ground connection conductor provided on the dielectric layer or the piezoelectric substrate, it is not necessary to provide inductance or capacitance by connection of an external device. Thus, the attenuation outside of the passband can be increased without preventing reduction in size.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, specific preferred embodiments of the present invention are described with reference to the drawings, thereby clarifying the invention.

Figure 1A:
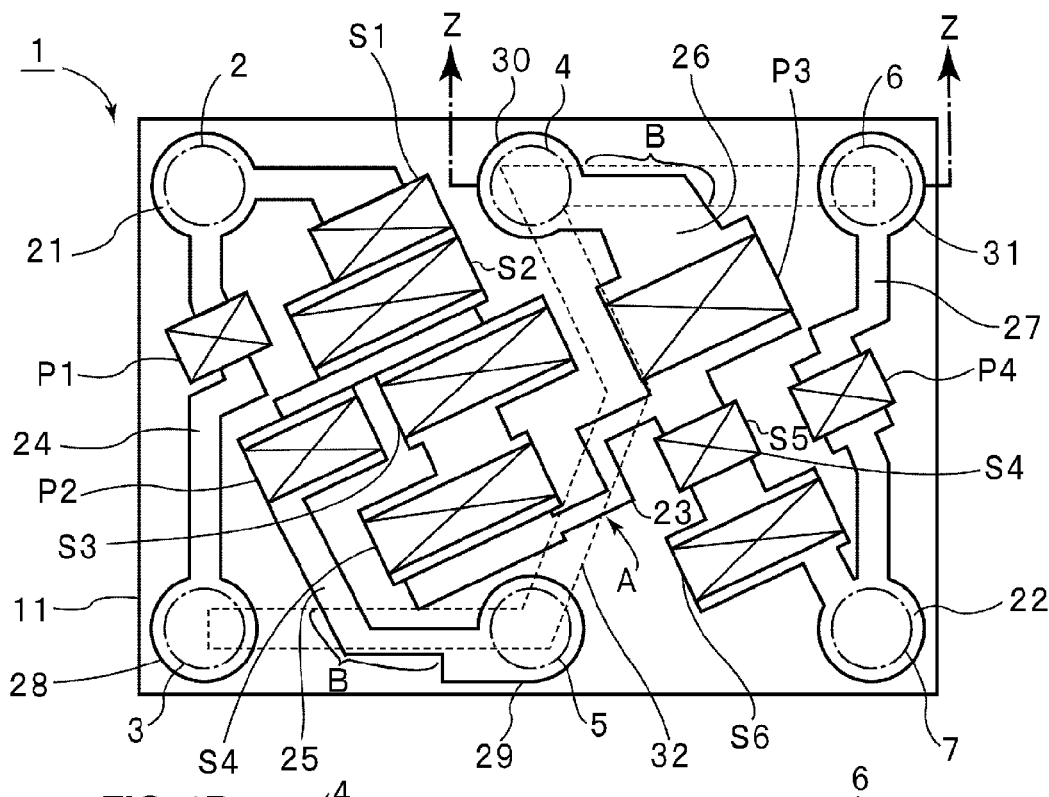
FIG. 1A is a schematic plan view of a boundary acoustic wave device according to a first preferred embodiment of the present invention.
Figure 1B:
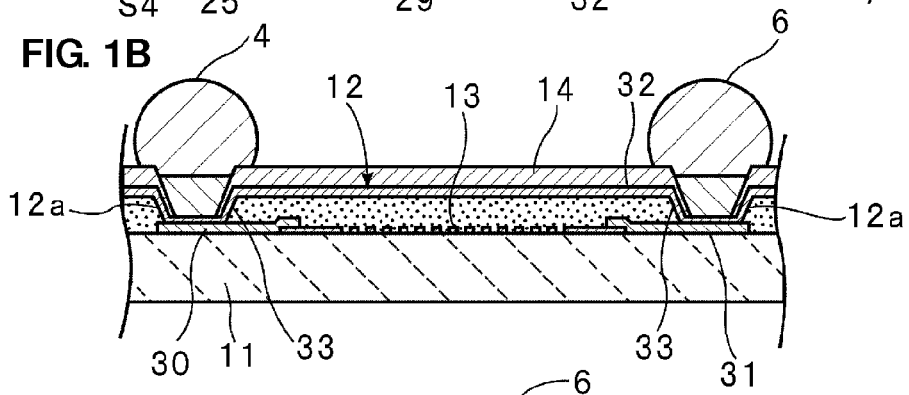
FIG. 1B is a front sectional view.
Figure 1C:
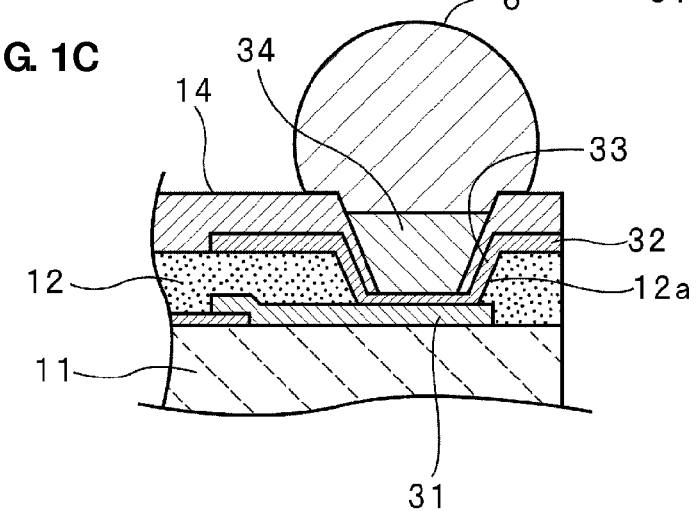
FIG. 1C is a partially cut off and magnified front sectional view of the main portions of the boundary acoustic wave device.

FIG. 1A is an explanatory schematic plan view of the main portions of a boundary acoustic wave filter device according to a first preferred embodiment of the present invention, FIG. 1B is a simplified partial front sectional view of the boundary acoustic wave device, and FIG. 1C is a partially cut off and magnified front sectional view of the main portions shown in FIG. 1B.

Figure 2:
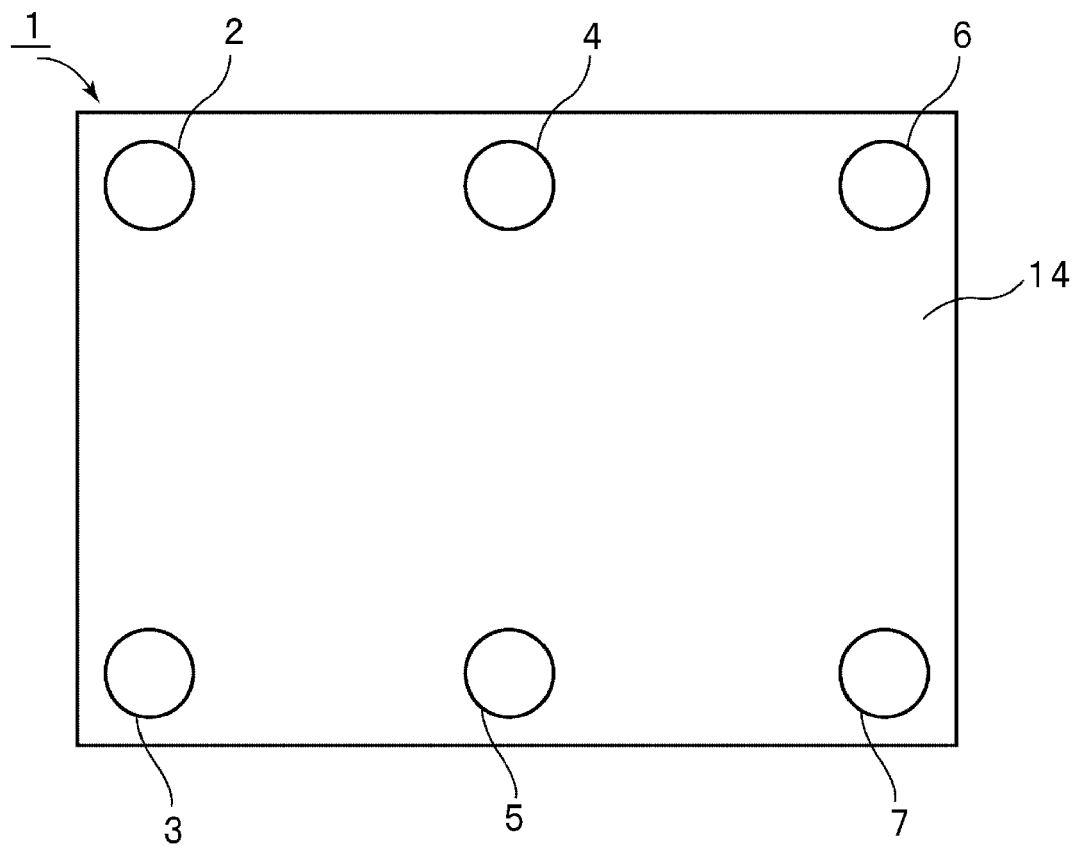
FIG. 2 is a plan view of a boundary acoustic wave device according to the first preferred embodiment of the present invention.

FIG. 2 is a plan view of a boundary acoustic wave device according to the first preferred embodiment of the present invention.

Referring to FIG. 2, the boundary acoustic wave device 1 preferably has a substantially planar rectangular shape, for example. The boundary acoustic wave device 1 includes metal bumps 2 to 7 arranged on the upper surface thereof. By utilizing the metal bumps 2 to 7, the boundary acoustic wave device 1 can be surface-mounted on a printed circuit board and other suitable structure using a flip chip bonding process, for example.

Referring to FIG. 1B, the boundary acoustic wave device 1 includes a piezoelectric substrate 11. The piezoelectric substrate 11 in the first preferred embodiment is preferably a $LiNbO_3$ substrate, for example. The piezoelectric substrate 11 is preferably made of a piezoelectric single crystal, such as $LiNbO_3$, $LiTaO_3$, and quartz, for example. The piezoelectric substrate 11 may be made of a piezoelectric material other than a piezoelectric single crystal, such as a piezoelectric ceramic, for example.

A dielectric layer 12 is stacked on the upper surface of the piezoelectric substrate 11. The dielectric layer 12 in the first preferred embodiment is preferably an $SiO_2$ layer having a thickness of about 6 μm, for example. However, the dielectric layer 12 may be made of any appropriate dielectric material, such as inorganic dielectric materials including other dielectric ceramics, SiN, or organic dielectric materials including synthetic resins, for example.

An electrode structure 13 is arranged at the interface between the piezoelectric substrate 11 and the dielectric layer 12. A ladder filter circuit, described later, is defined by the electrode structure 13.

FIG. 1B is a simplified sectional view taken along line Z-Z of FIG. 1A. Although the electrode structure 13 does not actually appear in this sectional view, the electrode structure 13 is illustrated in FIG. 1B for ease of understanding.

The electrode structure 13 is preferably made of a metal, such as Au, Pt, Al, or Cu or a metal alloy primarily including the same, for example. The electrode layer defining the electrode structure 13 may preferably be a stack of a plurality of metal layers.

A sound absorbing resin layer 14 is arranged so as to cover the dielectric layer 12. The sound absorbing resin layer 14 is provided to absorb waves that propagate toward the upper surface side of the dielectric layer 12. Examples of such sound absorbing resins include an appropriate material, such as polyimide.

The dielectric layer 12 includes a plurality of through holes 12a provided therein. One of the metal bumps 2 to 7, described above, is arranged at each location at which the through hole 12a is provided. FIG. 1A is a schematic plan view of the electrode structure 13 in the state in which the dielectric layer 12 and the sound absorbing resin layer 14 have been removed from the boundary acoustic wave device 1.

Figure 3:
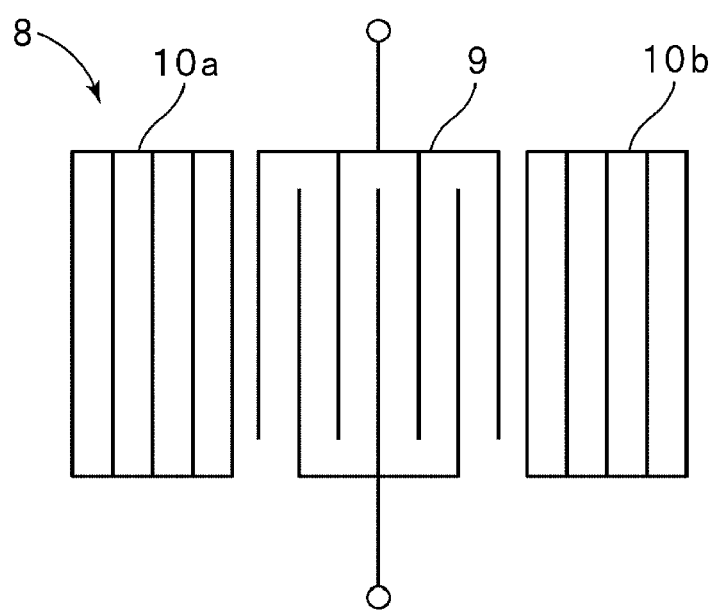
FIG. 3 is a schematic diagram of an electrode structure of a one-port boundary acoustic wave resonator defining a series arm resonator or a parallel arm resonator.
Figure 4:
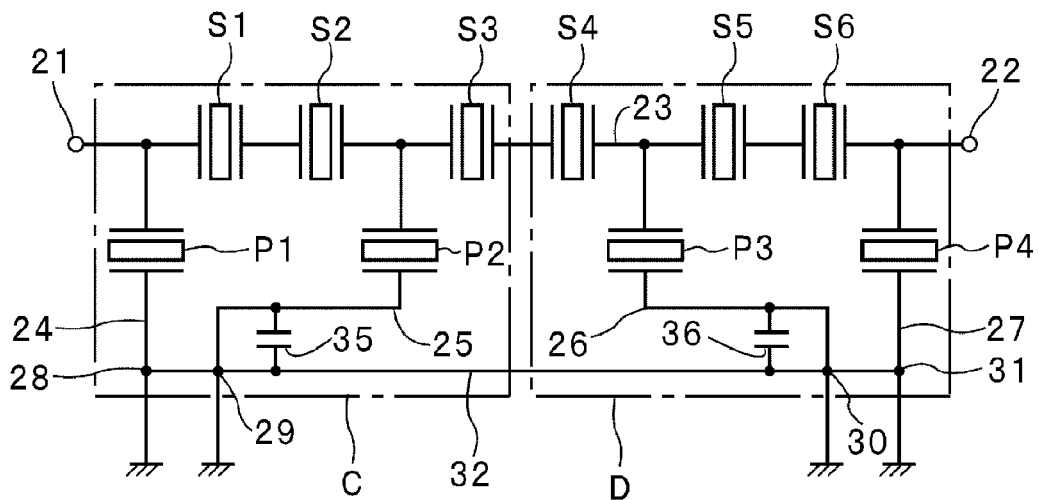
FIG. 4 is a circuit diagram of the boundary acoustic wave device according to the first preferred embodiment of the present invention.

The electrode structure 13 provided on the piezoelectric substrate 11 defines a ladder filter circuit including series arm resonators S1 to S6 and parallel arm resonators P1 to P4. FIG. 4 is a circuit diagram of this ladder filter. Each of the series arm resonators S1 to S6 and parallel arm resonators P1 to P4 is preferably a one-port boundary acoustic wave resonator. FIG. 3 illustrates a schematic electrode structure of the one-port boundary acoustic wave resonator. Referring to FIG. 3, the one-port boundary acoustic wave resonator 8 includes an IDT electrode 9 and reflectors 10a and 10b arranged on both sides of the IDT electrode 9 in the boundary acoustic wave propagation direction. The IDT electrode 9 includes a pair of comb electrodes that include a plurality of interdigitated electrode fingers.

For ease of illustration, the above-described electrode structure of the one-port boundary acoustic wave resonator is omitted in FIG. 1A. In other words, in FIG. 1A, the portions provided with the series arm resonators S1 to S6 and the parallel arm resonators P1 to P4 are schematically shown as rectangular boxes with a cross mark therein.

Referring to FIG. 4, in the ladder circuit configuration of the first preferred embodiment, the series arm resonators S1 to S6 are connected to one another in series on the series arm connecting an input terminal 21 and an output terminal 22. A plurality of parallel arms are connected between the series arm and the ground potential. In other words, a plurality of parallel arms respectively including the parallel arm resonators P1 to P4 are connected between the series arm and the ground potential.

The above-described electrode structure 13 includes signal lines 23 arranged to connect the series arm resonators S1 to S6 to one another, ground wiring lines 24 to 27, first ends of which are connected to the parallel arm resonators P1 to P4 in order to connect the parallel arm resonators P1 to P4 to the ground potential, and ground pads 28 to 31 connected to the second ends, i.e., ground potential side ends, of the ground wiring lines 24 to 27. The electrode structure 13 also includes the input terminal 21 defined by an electrode pad electrically connected to the signal line 23, and the output terminal 22 defined by an electrode pad connected to the output side.

In FIG. 1A, locations in which the above-described metal bumps 2 to 7 are provided are schematically represented by one-dot chain lines. The metal bumps 2 and 7 are connected to the input terminal 21 and the output terminal 22. The metal bumps 3 to 6 respectively provided on the ground pads 28 to 31 are electrically connected to the ground pads 28 to 31. Here, the series arm connecting the input terminal 21 and the output terminal 22 is arranged between the ground pads 28 and 29 and the ground pads 30 and 31. When the piezoelectric substrate 11 is reduced in size, the series arm must be arranged between at least two ground pads, due to restrictions on the arrangement of the respective resonators and ground pads.

In the first preferred embodiment, even when the series arm is arranged between at least two ground pads, all of the ground pads 28 to 31 are electrically connected as shown in FIG. 4, whereby grounding is strengthened. This will be more specifically described below.

Referring to FIG. 1A, the dashed line represents a ground connection electrode 32 provided on the upper surface of the dielectric layer 12 described above. The ground connection electrode 32 connects all of the ground pads 28 to 31 to one another, thereby strengthening grounding. The ground connection electrode 32 is preferably made of an appropriate metal such as Ag, Al, or Cum or a metal alloy primarily including the same, for example.

FIG. 1C is a schematic sectional view of the portion in which the ground pad 31 is provided. The ground pad 31 is electrically connected to the IDT electrode defining the parallel arm resonator P4, by the ground wiring line 27. To expose the ground pad 31, the through hole 12a is provided in the dielectric layer 12. A via hole conductor 33 is arranged so as to cover the inner surface of the through hole 12a. The lower end of the via hole conductor 33 extends to the upper surface of the ground pad 31 so as to be electrically connected thereto. The upper end of the via hole conductor 33 is continuously connected to the ground connection electrode 32. In the first preferred embodiment, the via hole conductor 33 is preferably made of the same material and process as the ground connection electrode 32, for example. However, the via hole conductor 33 and the ground connection electrode 32 may be individually formed using different materials.

The via hole conductor 33 and the ground connection electrode 32 may be formed using any appropriate method, such as evaporation coating or sputtering, for example.

Note that in FIG. 1C an under-bump metal layer 34 is preferably arranged in a portion surrounded by the via hole conductor 33, and the metal bump 6 is preferably disposed on the under-bump metal layer 34.

The electrical connection structure of the ground pad and the ground connection electrode 32 has been described. The other ground pads 28 to 30 are similarly exposed in the through holes 12a provided in the dielectric layer 12, and electrically connected to one another by an electrical connection structure between the via hole conductors 33 and the ground connection electrode 32.

In other words, all of the ground pads 28 to 31 are electrically connected to one another by the plurality of the via hole conductors 33 and the ground connection electrode 32 in the first preferred embodiment. Thus, as shown in FIG. 4, the parallel arm resonators P1 to P4 corresponding to the ground pads 28 to 31 are connected to the ground potential at the ends thereof used to connect to the ground potential, via various paths, whereby the grounding is strengthened. This increases the attenuation outside of a passband, as will be described later.

In the first preferred embodiment, the signal line 23 three-dimensionally crosses the ground connection electrode 32 with the dielectric layer 12 therebetween in a portion denoted by an arrow A in FIG. 1A. Thus, even when the ground pads 28 and 29 are separated from the ground pads 30 and 31 by the series arm on the piezoelectric substrate 11, all of the ground pads 28 to 31 can be electrically connected to one another without increasing the size of the planar shape of the boundary acoustic wave device 1, thereby making it possible to strengthen grounding. In addition, it is preferable to arrange the ground connection electrode 32 so as to three-dimensionally cross a portion of the signal line 23 rather than the IDT electrode, since this will not change the characteristics of the filter.

Further, in the first preferred embodiment, the ground connection electrode 32 is electrically connected to all of the ground pads 28 to 31, and includes portions B at which the ground connection electrode 32 faces the ground wiring lines 25 and 26 with the dielectric layer 12 therebetween. Thus, a capacitance represented by capacitors 35 and 36 shown in FIG. 4 is generated. The generation of this capacitance increases the number of paths connected to the ground potential, thereby further strengthening the grounding, and thus, improving the attenuation characteristics outside of the passband.

Note that, in the first preferred embodiment, although all of the ground pads 28 to 31 provided on the dielectric layer 12 are commonly connected by the ground connection electrode 32 as shown in FIG. 1A, the ground pads 28 and 29 may be electrically connected by a ground connection conductor provided on the piezoelectric substrate. Similarly, the ground pads 30 and 31 may be electrically connected by a ground connection conductor provided on the piezoelectric substrate. In other words, it is not necessary that all of the ground pads 28 to 31 are electrically connected by the ground connection electrode 32 provided on the dielectric substrate 12, as long as all of the ground pads 28 to 31 are electrically connected to one another.

Thus, it is only necessary that at least two of the ground pads are electrically connected by the two via hole conductors 33 and the ground connection electrode 32.

Referring to FIG. 4, the series arm resonators S1 to S6 are connected to the series arm, and the parallel arm resonators P1 to P4 are respectively connected to the four parallel arms. In this case, the input terminal 21 side is referred to as the first filter circuit C and the output terminal 22 side is referred to as the second filter circuit D. The first filter circuit C is a portion including the series arm resonators S1 to S3 and the parallel arm resonators P1 to P2, and the second filter circuit D is a portion including the series arm resonators S4 to S6 and the parallel arm resonators P3 to P4. The ground connection electrode 32 electrically connects the ground side ends of the first filter circuit C and the second filter circuit D.

However, the ladder circuit configuration to which the first preferred embodiment is applied is not limited to the configuration shown in FIG. 4. Preferred embodiments of the present invention can be applied to any appropriate ladder filter in which a plurality of series arm resonators are arranged on a series arm and at least one parallel arm resonator is arranged on each of a plurality of parallel arms, for example.

Advantages of the first preferred embodiment will now be described based on an example experiment for comparison with a known example.

Figure 6:
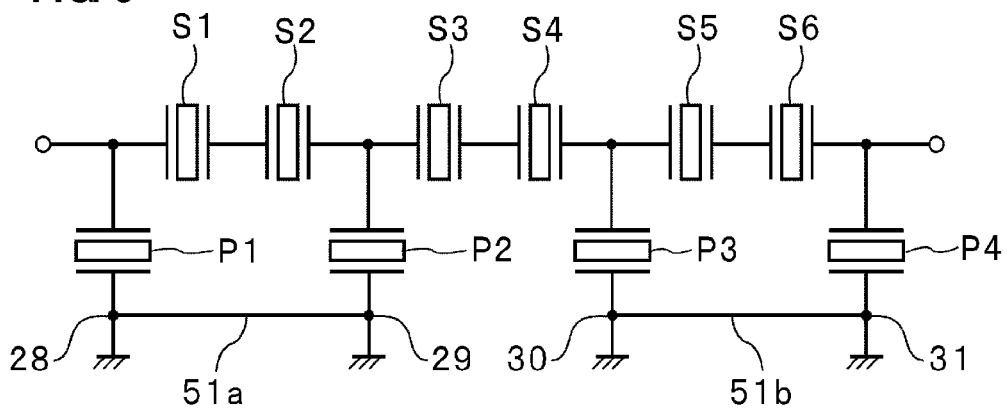
FIG. 6 is a circuit diagram of the boundary acoustic wave device of the first comparative example shown in FIG. 5.

For comparison, a ladder filter having the configuration shown in FIG. 6 was prepared as a first comparative example. As will be clear from the comparison between FIG. 4 and FIG. 6, in the ladder circuit of the first comparative example, the ground side end of the first parallel arm resonator P1 is not electrically connected to the ground side end of the third parallel arm resonator P3. In other words, the ground side ends of the first filter circuit and the second filter circuit are not electrically connected to each other. Since the other portions of the configuration of the first comparative example are substantially the same as those shown in FIG. 4, the same reference numerals are used.

Figure 5:
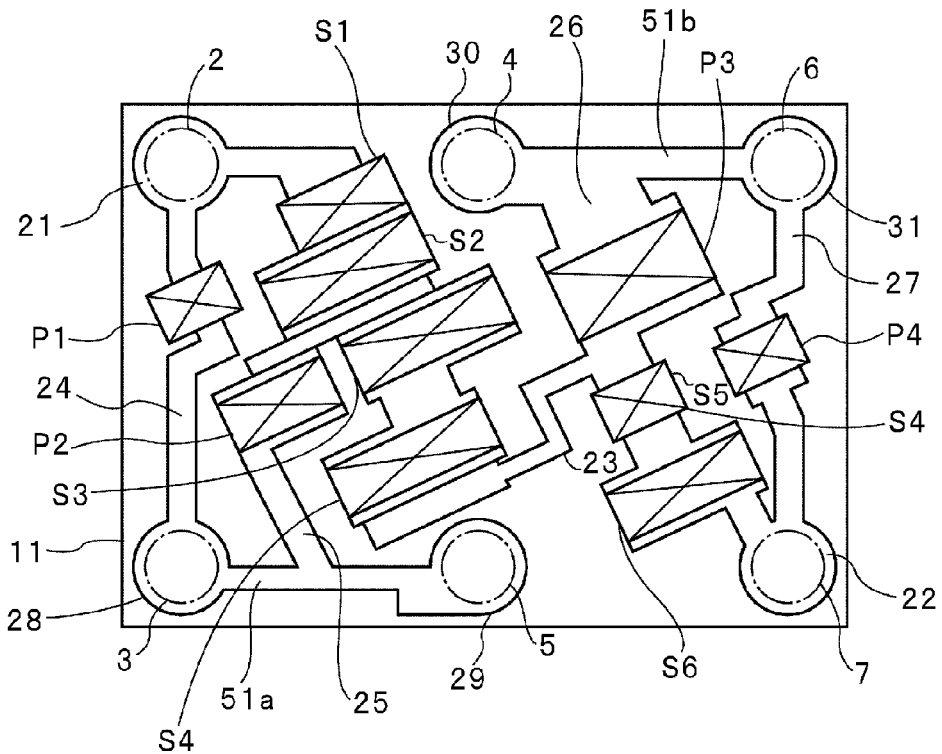
FIG. 5 is a schematic plan view of a boundary acoustic wave device of a first comparative example prepared for comparison with the first preferred embodiment of the present invention.

FIG. 5 is a schematic plan view of the boundary acoustic wave device of the first comparative example having the circuit configuration shown in FIG. 6, and corresponds to FIG. 1A which shows the first preferred embodiment. The two configurations are similar except that, in FIG. 5, the ground connection electrode 32 provided on the dielectric layer 12 is not provided, the ground pads 28 and 29 are electrically connected to each other by a ground connection conductor 51a provided on the piezoelectric substrate 11, and the ground pads 30 and 31 are electrically connected to each other by a ground connection conductor 51b provided on the piezoelectric substrate 11.

Figure 7:
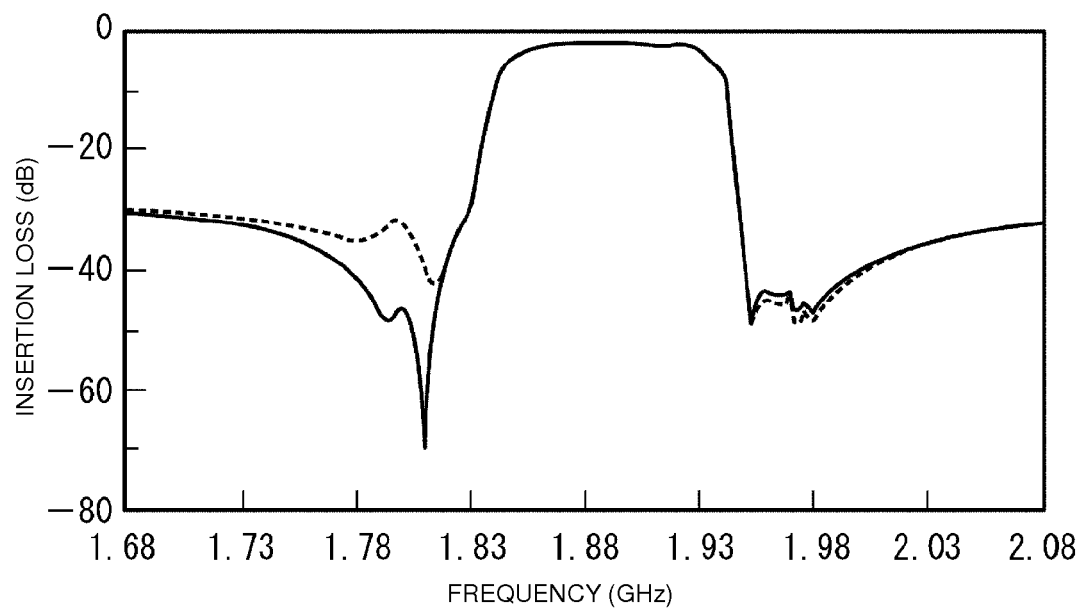
FIG. 7 illustrates the attenuation frequency characteristics of the boundary acoustic wave devices according to the first preferred embodiment and the first comparative example.

FIG. 7 illustrates the attenuation frequency characteristics of the boundary acoustic wave devices of the first preferred embodiment and the first comparative example.

Referring to FIG. 7, the solid line shows the results of the first preferred embodiment, and the dashed line shows the results of the first comparative example. As will be clear from FIG. 7, compared to the first comparative example, the first preferred embodiment has significantly improved attenuation outside of the passband, and particularly the attenuation on the lower frequency side of the passband. The reason for this is because, as described above, grounding is strengthened due to all of the ends connected to the ground pads 28 to 31 being electrically connected by the electrical connection structure including the ground connection electrode 32, and grounding has also been strengthened by the addition of the capacitors 35 and 36.

Consequently, according to the first preferred embodiment, the attenuation outside of the passband is significantly increased without providing a large inductance or a large capacitance.

Figure 8:
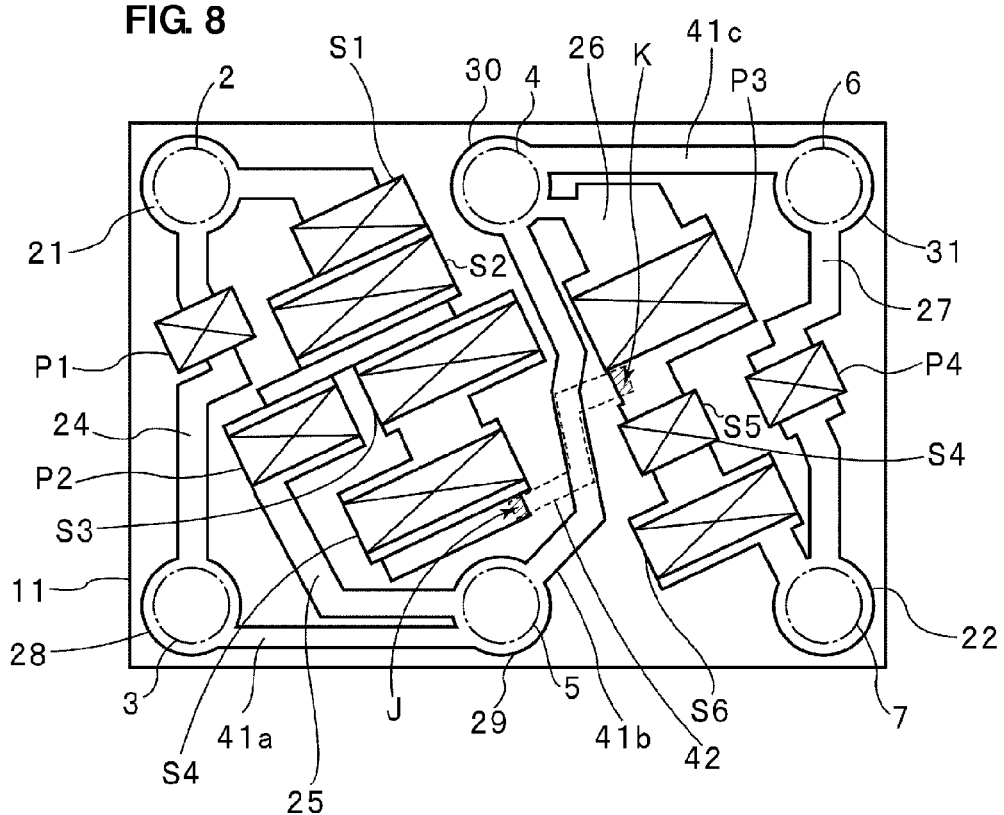
FIG. 8 is a schematic plan view of a boundary acoustic wave device according to a second preferred embodiment of the present invention.

FIG. 8 is a schematic plan view of a boundary acoustic wave device according to a second preferred embodiment of the present invention, and corresponds to FIG. 1A showing the first preferred embodiment.

In FIG. 8, the ground connection electrode 32 provided on the dielectric layer 12 is not provided, and all of the ground pads 28 to 31 are electrically connected by electrode patterns provided on the piezoelectric substrate 11. In other words, the ground pads 28 to 31 are electrically connected by ground connection conductors 41a to 41c provided on the piezoelectric substrate 11. A signal wiring line 42 connecting the series resonators S3 and S4 is arranged to three-dimensionally cross the ground connection conductor 41b. In other words, the signal wiring line 42 is a conductor provided on the dielectric layer 12 similarly to the ground connection electrode 32. Referring again to FIG. 8, the series resonators S3 and S4 are preferably electrically connected to the signal wiring line 42 by through holes and via hole conductors provided in the shaded portions denoted by arrows J and K. Thus, as long as all of the ground pads 28 to 31 are electrically connected to one another, all of the wiring lines providing electrical connection may be provided on the upper surface of the piezoelectric substrate 11. Thus, in the second preferred embodiment, the facing portions denoted by B in FIG. 1A are not provided. In other words, in the first preferred embodiment, the facing portions are provided at portions of the ground connection electrode 32 that face the ground wiring lines with the dielectric layer 12 therebetween. On the other hand, in the second preferred embodiment shown in FIG. 8, the above-described facing portions are not provided, and the ground wiring line 25 faces a ground connection conductor 41a on the piezoelectric substrate, and the ground wiring line 26 faces a ground connection conductor 41c on the piezoelectric substrate. The other portions of the second preferred embodiment are similar to those of the first preferred embodiment.

Figure 9:
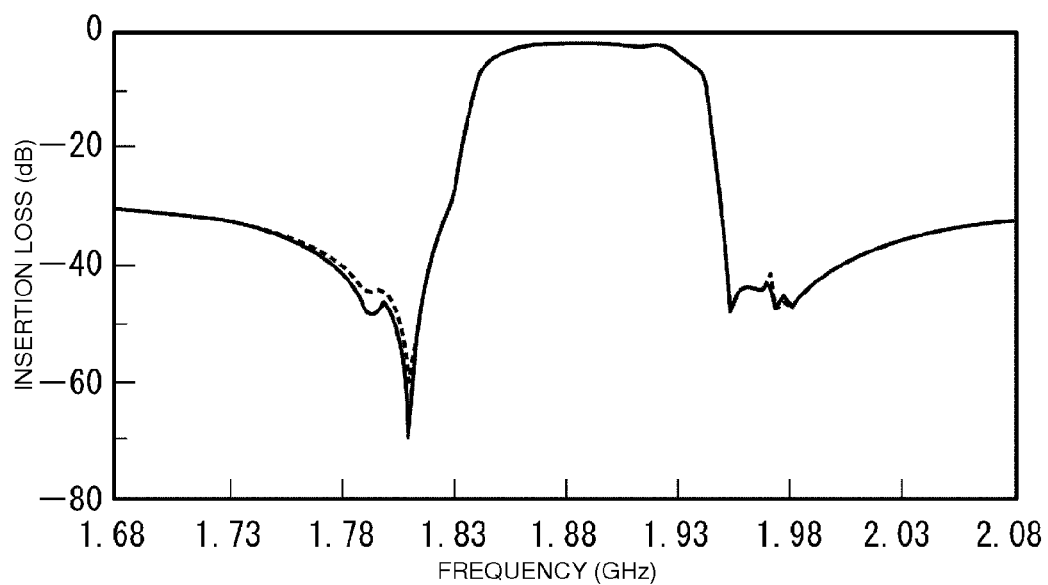
FIG. 9 illustrates the attenuation frequency characteristics of the boundary acoustic wave devices according to the first and the second preferred embodiments of the present invention.
Figure 10:
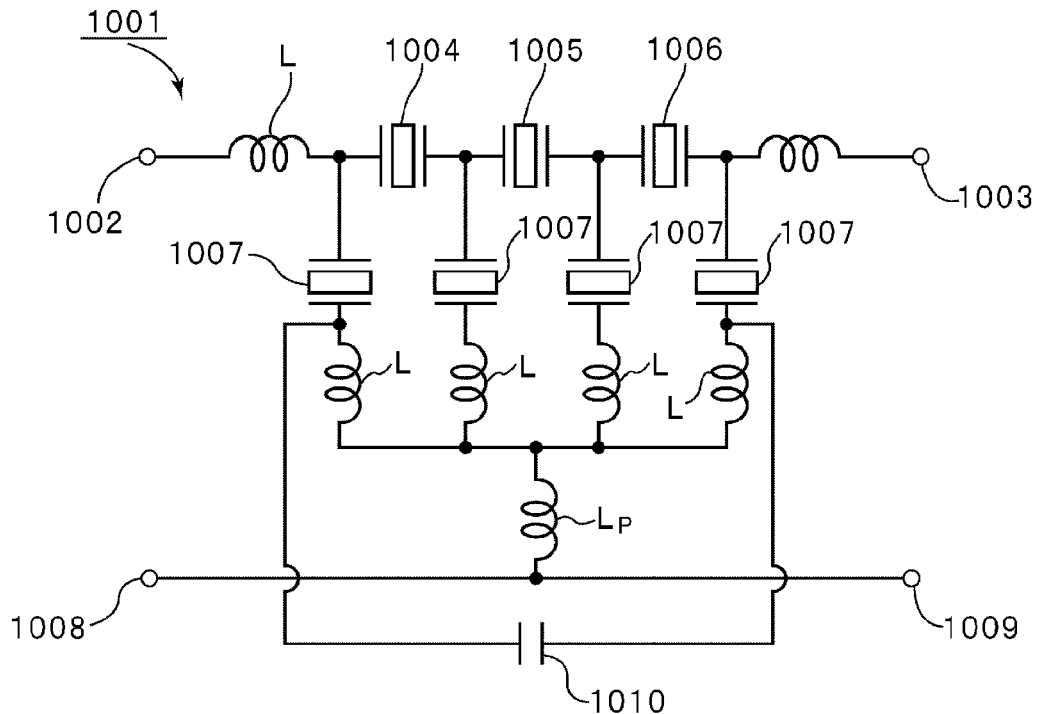
FIG. 10 is a circuit diagram of a known surface acoustic wave filter device.

FIG. 9 illustrates the attenuation frequency characteristics of the boundary acoustic wave devices of the first preferred embodiment and the second preferred embodiment. The solid line shows the results of the first preferred embodiment, and the dashed line shows the results of the second preferred embodiment. In the second preferred embodiment, the attenuation characteristics on the lower frequency side of the passband are slightly worse than those of the first preferred embodiment. The reason for this is that the ground wiring lines face the ground connection wiring lines only on the piezoelectric substrate, and the facing portions at which they face each other with the dielectric layer 12 therebetween are not provided. In other words, this is due to the fact that in the first preferred embodiment, by providing the facing portion B, additional capacitance is effectively provided and further strengthens grounding, whereby the attenuation characteristics outside of the passband are improved. However, as compared to the first comparative example described above, the second preferred embodiment also has significantly improved attenuation outside of the passband.

In order for the second preferred embodiment to have the same level of attenuation outside of the passband as the first preferred embodiment, a capacitance corresponding to that generated by the facing portion B must be added. More specifically, capacitors each preferably having a capacitance of about 0.05 pF, for example, must be added between the ground wiring lines connected to the ground side ends of the plurality of the parallel arm resonators provided on the piezoelectric substrate, for example, respectively between the ground wiring lines 25 and 26, and between the ground wiring lines 24 and 27. However, such a configuration will increase the size of the boundary acoustic wave device since the capacitors each having a capacitance of about 0.05 pF, for example, must be provided on the piezoelectric substrate using the comb electrode pattern. The use of external capacitors instead will increase in the number of components required for the boundary acoustic wave device. Thus, the first preferred embodiment has an advantage over the second preferred embodiment in terms of both the characteristics outside of the passband and a reduction in size.

Figure 11:
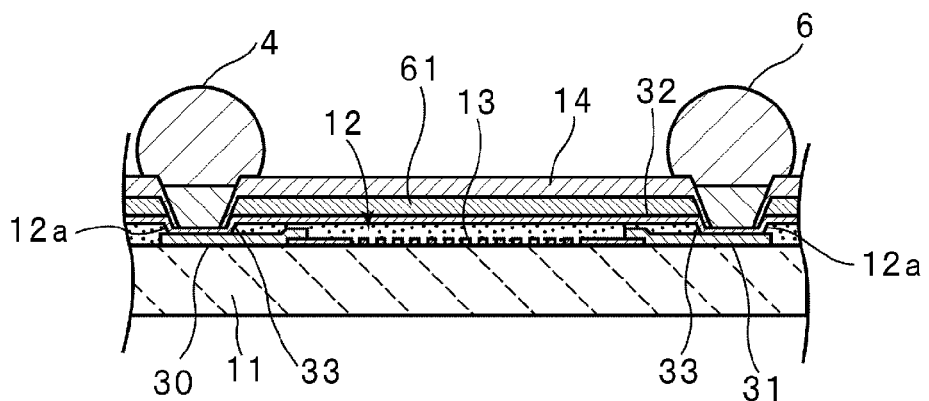
FIG. 11 is a schematic front sectional view of a boundary acoustic wave device according to a third preferred embodiment of the present invention.

Although the boundary acoustic wave device 1 including a layer structure in which the sound absorbing resin layer 14 is arranged so as to cover the dielectric layer 12 preferably defined by an $SiO_2$ layer is shown as an example in the first preferred embodiment, the layer structure of the boundary acoustic wave device 1 according to preferred embodiments of the present invention is not limited to this. For example, the layer structure may be a layer structure shown in FIG. 11, which is a simplified partial front sectional view of a boundary acoustic wave device according to a third preferred embodiment of the present invention. In the third preferred embodiment, a second dielectric layer 61 preferably made of SiN, for example, is provided on the dielectric layer 12 which is thinner than in the first preferred embodiment. The other portions of the third preferred embodiment are similar to those of the first preferred embodiment.

By providing on the dielectric layer 12 the second dielectric layer 61 made of a material such as SiN, for example, whose acoustic velocity of transversal waves propagating therethrough is greater than the acoustic velocity of transversal waves propagating through $SiO_2$, the vibration energy of the boundary acoustic waves can be effectively confined. In the third preferred embodiment, as compared to the first preferred embodiment, since the thickness of the dielectric layer 12 is reduced, the capacitance generated in the facing portion B at which portions of the ground connection electrode 32 face the ground wiring lines underneath with the dielectric layer 12 therebetween is greater, whereby the attenuation characteristics outside of the passband are further improved. Although the sound absorbing resin layer 14 is preferably provided on the second dielectric layer 61, the sound absorbing resin layer 14 is not necessarily required.

Figure 12:
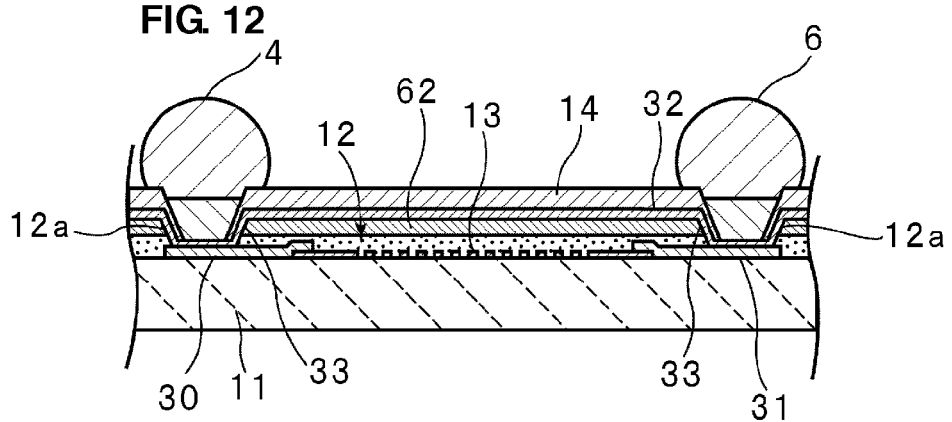
FIG. 12 is a schematic front sectional view of a boundary acoustic wave device according to a fourth preferred embodiment of the present invention.

FIG. 12 is a simplified partial front sectional view of a boundary acoustic wave device according to a fourth preferred embodiment of the present invention. The boundary acoustic wave device 1 according to preferred embodiments of the present invention may preferably include the layer structure shown in FIG. 12. In other words, in the fourth preferred embodiment, a second dielectric layer 62 preferably made of SiN, for example, is arranged between the dielectric layer 12 which is thinner than in the first preferred embodiment and the ground connection electrode 32. The other portions of the fourth preferred embodiment are similar to those of the first preferred embodiment. Note that, the sound absorbing resin layer 14 is not necessarily required. The fourth preferred embodiment can also improve the attenuation characteristics outside of the passband, similarly to the first preferred embodiment.

Note that although the ground connection electrode 32 is provided on a layer in the third and fourth preferred embodiments similarly to the first preferred embodiment, the signal wiring line 42 may, alternatively, be provided on the layer similarly to the second preferred embodiment.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A boundary acoustic wave device, comprising:
a piezoelectric substrate;
a first dielectric layer provided on the piezoelectric substrate; and
an electrode structure provided at an interface between the piezoelectric substrate and the first dielectric layer; wherein
the electrode structure includes:
a plurality of series arm resonators connected to one another in series on a series arm that connects an input terminal and an output terminal;
a parallel arm resonator connected between the series arm and a ground potential on each of a plurality of parallel arms provided between the series arm and the ground potential;
a plurality of ground wiring lines respectively connected to ends of the plurality of the parallel arms to be connected to the ground potential; and
a plurality of ground pads respectively connected to the plurality of the ground wiring lines; wherein
the electrode structure defines a ladder filter;
the boundary acoustic wave device further comprises:
a signal wiring line defining the series arm arranged so as to be located between at least two of the plurality of the ground pads; and
a ground connection conductor arranged to electrically connect the at least two of the plurality of ground pads;
the signal wiring line is arranged to three-dimensionally cross the ground connection conductor with the first dielectric layer therebetween; and
all of the plurality of ground pads are electrically connected to one another.

2. The boundary acoustic wave device according to claim 1, wherein
the signal wiring line is provided on the piezoelectric substrate;
the ground connection conductor is provided on the first dielectric layer and electrically connected to the at least two of the plurality of ground pads through via hole conductors extending through the first dielectric layer; and
the signal wiring line is arranged to three-dimensionally cross the ground connection conductor with the first dielectric layer therebetween.

3. The boundary acoustic wave device according to claim 1, wherein the ground connection conductor is electrically connected to all of the plurality of ground pads.

4. The boundary acoustic wave device according to claim 1, wherein the boundary acoustic wave device includes a facing portion at which the ground connection conductor faces the ground wiring line with the first dielectric layer therebetween, and a capacitance is provided at the facing portion.

5. The boundary acoustic wave device according to claim 1, wherein
a portion of the signal wiring line is provided on the first dielectric layer and is electrically connected to the other portions of the signal line through via hole conductors extending through the first dielectric layer;
the ground connection conductor is provided on the piezoelectric substrate; and
the portion of the signal wiring line is arranged to three-dimensionally cross the ground connection conductor with the first dielectric layer therebetween.

6. The boundary acoustic wave device according to claim 1, wherein the ladder filter includes a first filter circuit portion arranged on an input end side of the boundary acoustic wave device and a second filter circuit portion arranged on an output end side of the boundary acoustic wave device, each of the first and second filter circuit portions includes at least one of the series arm resonators connected to the series arm and at least one of the plurality of parallel arm resonators arranged on at least one of the parallel arms, and ends, to be connected to the ground potential, of the first and second filter circuit portions are electrically connected to each other by the ground connection conductor.

7. The boundary acoustic wave device according to claim 1, wherein through holes are provided in the first dielectric layer so as to at least partially expose the ground pads, and the via hole conductors are provided on the inner surfaces of the through holes, and the boundary acoustic wave device further comprises under-bump metal layers disposed in the through holes and metal bumps provided on the under-bump metal layers.

8. The boundary acoustic wave device according to claim 1, further comprising a sound absorbing resin layer arranged so as to cover the ground connection conductor or the portion of the signal wiring line provided on the first dielectric layer.

9. The boundary acoustic wave device according to claim 1, further comprising a second dielectric layer arranged so as to cover the ground connection conductor or the portion of the signal wiring line provided on the first dielectric layer.

10. The boundary acoustic wave device according to claim 1, further comprising a second dielectric layer provided between the first dielectric layer and the ground connection conductor or the portion of the signal wiring line provided on the first dielectric layer.

* * * * *